United States Patent
Jang et al.

(10) Patent No.: US 8,794,035 B2
(45) Date of Patent: *Aug. 5, 2014

(54) APPARATUS FOR MANUFACTURING HIGH PURITY POLYSILICON USING ELECTRON-BEAM MELTING AND METHOD OF MANUFACTURING HIGH PURITY POLYSILICON USING THE SAME

(75) Inventors: Bo Yun Jang, Daejeon (KR); Jin Seok Lee, Daejeon (KR); Joon Soo Kim, Daejeon (KR); Young Soo Ahn, Daejeon (KR)

(73) Assignee: Korea Institute of Energy Research, Daejeon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/464,416

(22) Filed: May 4, 2012

(65) Prior Publication Data
US 2013/0291595 A1    Nov. 7, 2013

(51) Int. Cl.
*C01B 33/037*    (2006.01)
*C30B 13/22*    (2006.01)

(52) U.S. Cl.
CPC ............ *C01B 33/037* (2013.01); *C30B 13/22* (2013.01)
USPC .............................................. 65/66

(58) Field of Classification Search
CPC ...... C01B 33/037; C30B 13/22; C30B 13/24; C30B 29/06
USPC ........................................................... 65/66
See application file for complete search history.

(56) References Cited

U.S. PATENT DOCUMENTS

| | | | | | |
|---|---|---|---|---|---|
| 4,256,681 | A | * | 3/1981 | Lindmayer | 264/85 |
| 5,454,424 | A | * | 10/1995 | Mori et al. | 164/469 |
| 5,961,944 | A | * | 10/1999 | Aratani et al. | 423/348 |
| 7,000,678 | B1 | * | 2/2006 | Mon et al. | 164/507 |
| 2010/0095883 | A1 | * | 4/2010 | Jang et al. | 117/206 |
| 2011/0142724 | A1 | * | 6/2011 | Moon et al. | 422/186 |

\* cited by examiner

*Primary Examiner* — Matthew Daniels
*Assistant Examiner* — Cynthia Szewczyk
(74) *Attorney, Agent, or Firm* — Patent Office of Dr. Chung Park

(57) ABSTRACT

Apparatus and method for manufacturing high purity polysilicon. The apparatus includes a vacuum chamber maintaining a vacuum atmosphere; first and second electron guns disposed at an upper side of the vacuum chamber to irradiate electron beams into the vacuum chamber; a silicon melting unit placed on a first electron beam-irradiating region corresponding to the first electron gun and in which powdery raw silicon is placed and melted by the first electron beam; and a unidirectional solidification unit placed on a second electron beam-irradiating region corresponding to the second electron gun and connected to the silicon melting unit via a runner. The unidirectional solidification unit is formed at a lower part thereof with a cooling channel and is provided therein with a start block driven in a downward direction.

13 Claims, 8 Drawing Sheets

(a)            (b)            (c)

APPARATUS FOR MANUFACTURING HIGH PURITY POLYSILICON USING ELECTRON-BEAM MELTING AND METHOD OF MANUFACTURING HIGH PURITY POLYSILICON USING THE SAME

BACKGROUND

1. Technical Field

The present invention relates to a technique for manufacturing polysilicon, and more particularly, to a technique for manufacturing high purity polysilicon having a purity of 99.9999% (6N) from metal-level raw silicon having a purity of 99 to 99.9% (2~3N) using electron-beam melting.

2. Description of the Related Art

Purity of silicon is typically represented by 2N, 3N, 6N, 11N, and the like. Here, the numeral in front of 'N' means the number of nines (9) in percent by weight (wt %). For example, 2N means a purity of 99%, 6N means a purity of 99.9999%, and 11N means a purity of 99.999999999%.

Semiconductor level silicon requires an ultra-high purity approaching 11N. However, as known in the art, silicon used as a raw material for photovoltaic cells and having a relatively low purity of 5N to 7N provides similar optical conversion efficiency to silicon having a high purity of 11N.

Semiconductor level silicon is produced through chemical gasification processes. However, such a silicon production process generates a large amount of contaminants, and has low production efficiency in spite of high production cost.

Thus, the silicon production process is not suited to production of semiconductor level silicon used as a raw material for photovoltaic cells, and efforts for developing metallurgical refining processes capable of achieving mass production of high purity silicon at low cost have been actively attempted.

Examples of metallurgical refining processes for production of high purity silicon for photovoltaic cells include a vacuum refining process, a wet refining process, an oxidation process, a unidirectional solidification refining process, and the like. Some of these refining processes are commercially used in the art.

Particularly, silicon manufacturing techniques based on metal melting such as vacuum refining and unidirectional solidification refining have been actively studied due to merits thereof, such as easy characteristic control and less contamination due to impurities during operation.

Here, the vacuum refining process is a process in which a raw metal is melted and impurities having lower boiling point and vapor pressure than silicon are removed from the molten metal, and the unidirectional solidification refining process is a process in which impurities are moved (segregated) along an interface between solid and liquid during phase change of silicon from liquid to solid.

Various types of vacuum and segregation refining processes according to energy sources have been developed, and most refining processes employ magnetic induction heating.

SUMMARY

The present invention provides an apparatus for manufacturing high purity polysilicon using electron-beam melting.

The present invention also provides a method of manufacturing high purity polysilicon, which can maximize silicon refining efficiency through control of electron-beam melting using the polysilicon manufacturing apparatus.

In accordance with one aspect of the present invention, an apparatus for manufacturing polysilicon includes: a vacuum chamber maintaining a vacuum atmosphere; first and second electron guns disposed at an upper side of the vacuum chamber to irradiate electron beams into the vacuum chamber; a silicon melting unit which is placed on a first electron beam-irradiating region corresponding to the first electron gun and to which powdery raw silicon is fed and melted by the first electron beam; and a unidirectional solidification unit placed on a second electron beam-irradiating region corresponding to the second electron gun and connected to the silicon melting unit via a runner. Here, the unidirectional solidification unit is formed at a lower part thereof with a cooling channel and is provided therein with a start block driven in a downward direction such that molten silicon fed from the silicon melting unit is transferred in the downward direction by the start block while being kept in a molten state by the second electron beam and is then solidified from a lower portion thereof to an upper portion thereof through the cooling channel.

In accordance with another aspect of the present invention, a method of manufacturing polysilicon includes: feeding powdery raw silicon to a silicon melting unit and melting the fed raw silicon by irradiating a first electron beam to the raw silicon using a first electron gun; continuously feeding and melting the raw silicon such that molten silicon is overflowed from the silicon melting unit; receiving, by an unidirectional solidification unit, the molten silicon overflowed from the silicon melting unit, transferring the molten silicon by driving, a start block in a downward direction followed by solidifying the molten silicon from a lower portion thereof to an upper portion thereof by using a fluid in order to form a refined silicon ingot; and cutting off an upper portion of the refined silicon ingot to remove metal impurities from the silicon ingot.

BRIEF DESCRIPTION OF THE DRAWINGS

The above and other aspects, features, and advantages of the invention will become apparent from the detailed description of the following embodiments in conjunction with the accompanying drawings.

DETAILED DESCRIPTION

Figure 1:
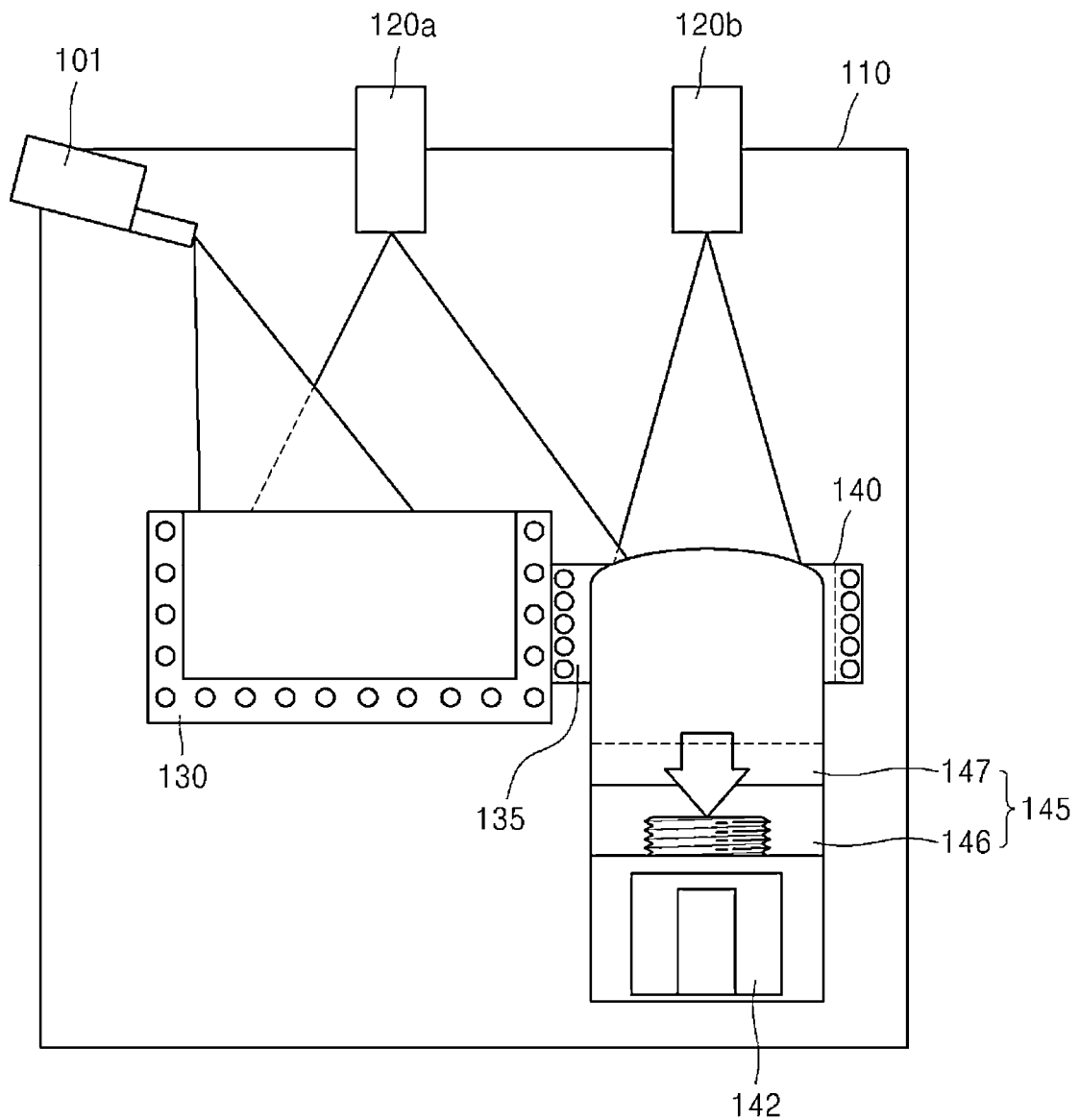
FIG. 1 is a schematic view of an apparatus for manufacturing high purity polysilicon using electron-beam melting in accordance with one embodiment of the present invention.

Embodiments of the invention will now be described in detail with reference to the accompanying drawings. It should be understood that the present invention is not limited to the following embodiments and may be embodied in different ways, and that the embodiments are given to provide complete disclosure of the invention and to provide thorough understanding of the invention to those skilled in the art. The scope of the invention is limited only by the accompanying claims and equivalents thereof. Like components will be denoted by like reference numerals throughout the specification.

Next, an apparatus and method for manufacturing high purity polysilicon using electron-beam melting according to embodiments of the invention will be described with reference to the accompanying drawings.

FIG. 1 is a schematic view of an apparatus for manufacturing high purity polysilicon using electron-beam melting according to one embodiment of the invention.

Referring to FIG. 1, the polysilicon manufacturing apparatus includes a vacuum chamber 110, two electron guns including a first electron gun 120a and a second electron gun 120b, a silicon melting unit 130, and a unidirectional solidification unit 140.

The vacuum chamber 110 is maintained at a high vacuum of 10-4 Torr during manufacture of polysilicon. When the interior pressure of the vacuum chamber 110 exceeds 10-4 Torr, volatilization of impurities becomes insufficient, thereby reducing silicon refining effects. In this embodiment, the vacuum chamber is maintained at 10-5 Torr.

The first and second electron guns 120a, 120b are placed at an upper side of the vacuum chamber 110 to irradiate electron beams into the vacuum chamber 110.

The silicon melting unit 130 is placed on a region to which a first electron beam is irradiated from the first electron gun 120a, that is, a first electron beam-irradiating region. Raw silicon is fed from a raw silicon supply unit 101 into the silicon melting unit 130, and is then melted by a first electron beam accelerated and accumulated by the first electron gun 120a.

Here, the first electron gun 120a may accelerate and accumulate the first electron beam to achieve an output energy of 4000 kW/m2 or less, for example, about 2000 to 4000 kW/m2 such that molten silicon does not exhibit unstable behavior like spattering out of a crucible.

The silicon melting unit 130 may be provided with a water-cooling type crucible, which is capable of facilitating control of cooling efficiency. The water-cooling type crucible may have a cooling channel which can be filled with a fluid at a surface of the crucible.

A material of the water-cooling type crucible may be copper (Cu) such that a molten silicon is not contaminated by an original material of the silicon melting unit 130 while a silicon is refined.

The unidirectional solidification unit 140 enables continuous casting of the molten silicon while inducing segregation of metal impurities, thereby enhancing silicon refining efficiency in production of high purity polysilicon.

The unidirectional solidification unit 140 is placed on a region to which a second electron beam is irradiated from the second electron gun 120b, that is, a second electron beam-irradiating region, and is connected to the silicon melting unit 130 via a runner 135 which may be attached to the silicon melting unit 130 or the unidirectional solidification unit 140. As the raw silicon is continuously fed into the silicon melting unit 130, the amount of molten silicon within the silicon melting unit 130 increases. Accordingly, the molten silicon overflowed from the silicon melting unit 130 is supplied into the unidirectional solidification unit 140 via the runner 135.

Further, the unidirectional solidification unit 140 is formed at a lower part thereof with a cooling channel 142 through which cooling water or the like is supplied to cool the molten silicon. Thus, a solidification efficiency of the molten silicon is improved. Further, the unidirectional solidification unit 140 is provided therein with a start block 145 which is driven in a downward direction.

The start block 145 is driven in the downward direction within the unidirectional solidification unit 140 to transfer the molten silicon in the downward direction while growing a cast for silicon casting.

In the unidirectional solidification unit 140, the molten silicon fed from the silicon melting unit 130 is transferred towards the cooling channel 142 by the start block 145 while being kept in a molten state by the second electron beam accelerated and accumulated by the second electron gun 120a, and is then solidified and cast in an upward direction by a fluid filled into the cooling channel 142, thereby forming polysilicon.

The second electron gun 120b may accelerate and accumulate the second electron beam to achieve an output energy of 1000 to 2000 kW/m2 such that the silicon is able to maintain in a molten state and the molten silicon does not exhibits unstable behavior like spattering out of the crucible. Because such unstable behavior of the molten silicon affects overflow of the molten silicon from the melting unit.

The unidirectional solidification unit 140 may include a copper casting container, which is formed at a lower part thereof with a cooling channel, as in the water cooling type crucible.

Figure 2:
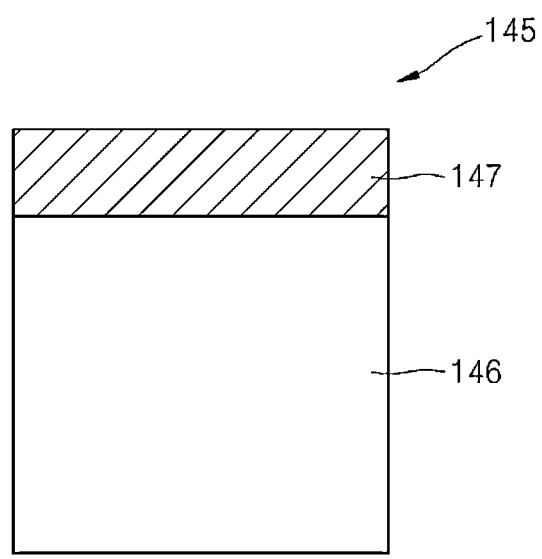
FIG. 2 is a sectional view of a start block in accordance with one embodiment of the present invention.

FIG. 2 is a sectional view of one embodiment of the start block 145 according to the present invention.

Referring to FIG. 2, the start block 145 may includes a high purity silicon button 147 joined to an upper side of a dummy bar 146.

The silicon button 147 may have a purity of 8N to 10N and a thickness of about 10 to 15 mm, and is formed when a silicon chunk is melted by the second electron beam and joined to the dummy bar 146 within the unidirectional solidification unit 140.

The dummy bar 146 may be made of a graphite material.

The silicon button 147 prevents the dummy bar 146 from coming into direct contact with the molten silicon or a cast silicon ingot in order to prevent the molten silicon or the cast silicon ingot from being contaminated by graphite of the dummy bar 146.

Specifically, the dummy bar 146 may be made of low density graphite and have a porous surface thereof. The graphite dummy bar 146 allows silicon molten by the second electron beam to be strongly joined to the dummy bar after infiltrating into and being solidified inside a porous surface of the graphite dummy bar. Thus it may prevent rapid variation in temperature between the lower cooling channel and the initial molten silicon.

In the apparatus according to the present embodiment, the pattern of electron beams irradiated from the first and second electron guns 120a, 120b, the output energy of the first and second electron beams, the amount of cooling water supplied to the unidirectional solidification unit 140, the amount of raw silicon fed to the silicon melting unit 130, and the growth rate of polysilicon within the unidirectional solidification unit 140 may be changed according to arrangement or size of the respective components.

Figure 3:
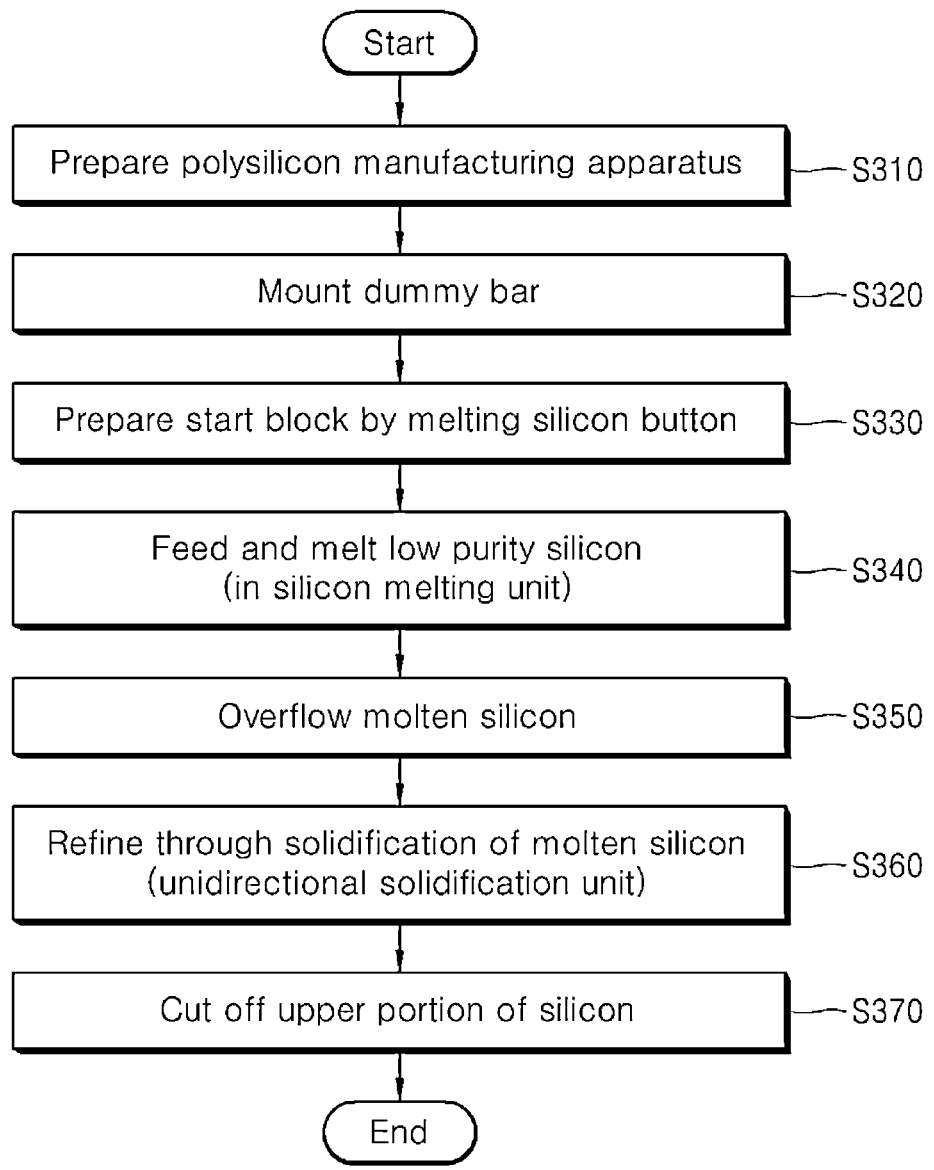
FIG. 3 is a flowchart of a method of manufacturing polysilicon in accordance with one embodiment of the present invention.

FIG. 3 is a flowchart of a method of manufacturing polysilicon in accordance with one embodiment of the present invention Referring to FIG. 3, the method of manufacturing polysilicon according to this embodiment includes preparing a polysilicon manufacturing apparatus in S310, mounting a dummy bar in S320, preparing a start block by melting a silicon button in S330, feeding and melting low purity silicon in S340, overflowing molten silicon in S350, refining through solidification of molten silicon in S360, and cutting off an upper portion of a cast silicon ingot in S370.

In operation S310 of preparing the polysilicon manufacturing apparatus, the apparatus including a vacuum chamber, first and second electron guns, a silicon melting unit, and a unidirectional solidification unit as shown in FIG. 1 is prepared.

In operation S320 of mounting a dummy bar, the dummy bar is mounted within the unidirectional solidification unit. Then, in operation S330 of preparing a start block, the start block is prepared by melting a silicon button on the dummy bar.

Specifically, mounting of the dummy bar and preparation of the start block may be performed by the following process.

First, a dummy bar made of graphite or the like is mounted inside the unidirectional solidification unit. Then, a silicon chunk is placed on the dummy bar. Next, the silicon chunk is melted by a second electron beam to be joined to the dummy bar under a vacuum atmosphere of about 10–5 Torr. Through this process, a start block having the silicon button placed at an upper portion of the start block and joined to the dummy bar placed at a lower portion thereof is formed.

Then, in operation S340 of feeding and melting low purity silicon, powdery raw silicon is fed to the silicon melting unit, and a first electron beam is irradiated upon the raw silicon from the first electron gun to melt the raw silicon. The powdery raw silicon may have a purity of 2N and a mean particle diameter of 1 to 2 mm.

While the raw silicon is melted by the first electron beam, volatile components, such as aluminum (Al), calcium (Ca), phosphorous (P), magnesium (Mg), and manganese (Mn), are removed from the raw silicon via vacuum volatilization.

Volatile impurities having lower boiling point and vapor pressure than silicon are volatilized at high temperature generated by the first electron beam under high vacuum. Here, refining efficiency may be enhanced by increasing the output energy and irradiation time of the first electron beam.

In operation S340, the first electron beam may be accelerated and accumulated by the first electron gun to achieve an output energy of about 4000 kW/m2, thereby facilitating silicon melting and removal of volatile impurities.

Figure 5:
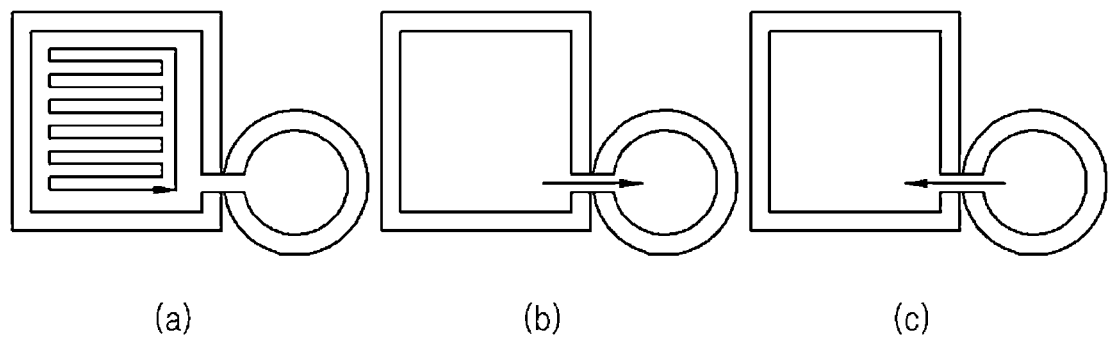
FIG. 5 shows one example of an electron beam irradiating pattern of a first electron gun.

Here, as shown in FIG. 5($a$), the first electron gun is configured to control surface flow of the molten silicon and to irradiate the first electron beam in a pattern of combs with heads arranged towards the runner within the silicon melting unit, so that the electron beam has a higher energy density near the runner, thereby improving melting efficiency. Further, as shown in FIGS. 5($b$) and 5($c$), the first electron beam is irradiated to the runner in a linearly reciprocating pattern to cause the molten silicon to flow towards the unidirectional solidification unit while maintaining the molten silicon at a uniform temperature within the runner. In order to maintain the molten silicon at a suitable temperature for a certain process, the energy density of the first electron beam may be regulated.

Next, in operation S350 of overflowing the molten silicon, the raw silicon is continuously fed to the silicon melting unit, and thus the amount of molten silicon within the silicon melting unit continues to increase, so that the molten silicon overflows from the silicon melting unit and is supplied to the unidirectional solidification unit through the runner.

Next, in operation S360 of refining the molten silicon through solidification of the molten silicon, the unidirectional solidification unit receives the molten silicon and transfers the molten silicon in a downward direction by driving the start block including the dummy bar in the downward direction, while keeping the silicon in a molten state by irradiating a second electron beam from the second electron gun upon the molten silicon. Then, the molten silicon is solidified from a lower portion thereof simultaneously with refining of the molten silicon from the lower portion thereof to an upper portion thereof, thereby providing a cast silicon ingot.

In operation S360, the second electron beam may be accelerated and accumulated by the second electron gun to achieve an output energy of about 1000 to 2000 kW/m2 in order to maintain the silicon in a molten state while being supplied from the silicon melting unit.

Figure 6:
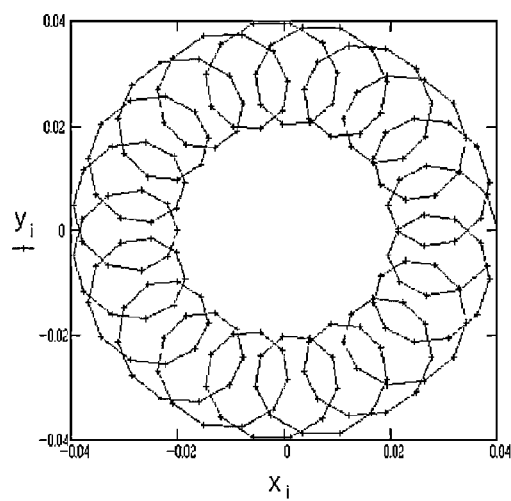
FIG. 6 shows one example of an electron beam irradiating pattern of a second electron gun.
Figure 6:
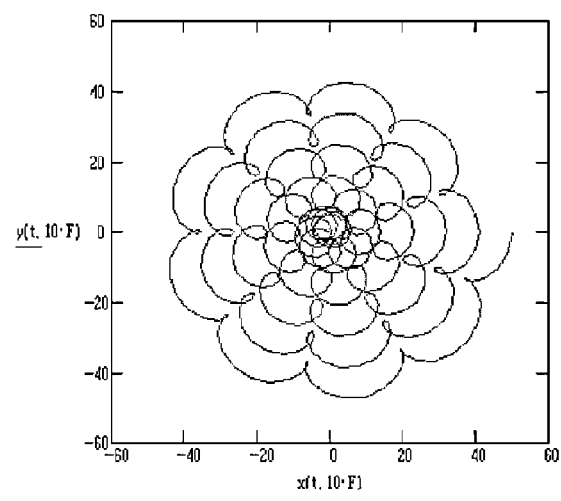

Here, as shown in FIG. 6, the second electron gun may irradiate the second electron bean in a complex circular or spiral pattern into the unidirectional solidification unit.

The pattern of the second electron beam is an important process factor, which determines not only a surface state of the molten silicon and a contact area of the molten silicon with an inner surface of the water cooling type crucible, but also temperature profile inside the molten silicon, thereby providing significant influence on refining efficiency. The complex circular or spiral pattern according to this embodiment minimizes contact between the molten silicon and the inner wall of the water cooling type crucible by maintaining the molten silicon in a convex surface shape during the process.

Figure 4:
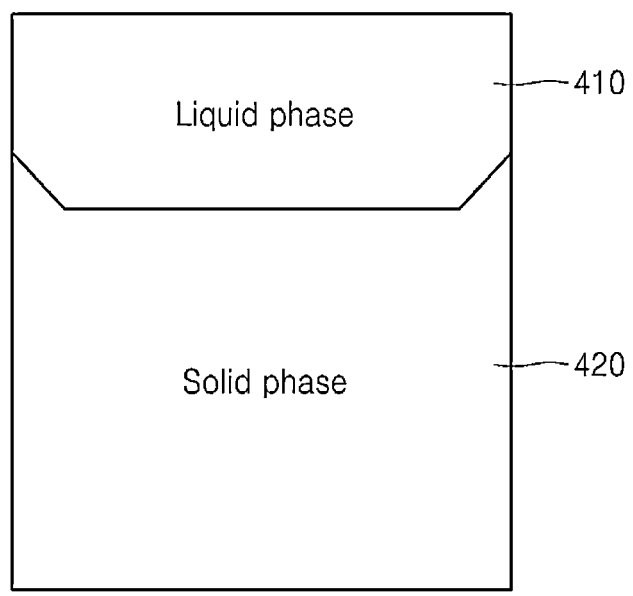
FIG. 4 shows one example of a solid/liquid interface formed by an electron beam pattern applicable to the present invention.

FIG. 4 shows one example of a solid phase 410 and a liquid phase 420 formed by the pattern of the second electron beam, and the complex circular or spiral pattern according to this embodiment makes the temperature profile of the molten silicon vertical to the growth direction as shown in FIG. 4, thereby maximizing refining efficiency.

In operation S360, the start block may be driven to descend at a rate of 0.005 to 0.05 mm/s to achieve process control as well as to prohibit the molten silicon from leaking below the unidirectional solidification unit.

In this process, iron (Fe), nickel (Ni), titanium (Ni), chromium (Cr), copper (Cu) and the like contained in the molten silicon move upwards along a solid/liquid interface. Such an effect of segregating the impurities may be sufficiently exhibited when temperature difference between the liquid phase and the solid phase is high while the solid/liquid interface is maintained to be vertical to the growth direction during solidification of the molten silicon.

According to this embodiment, in the unidirectional solidification unit, the molten silicon is cooled from the lower portion thereof to maximize the temperature difference between the solid phase and the liquid phase while the molten silicon is maintained in a molten state by the second electron beam and the solid/liquid interface is maintained to be vertical to the growth direction by the optimal pattern of the electron beam, thereby improving the effect of impurity segregation.

Next, in operation S370 of cutting off an upper portion of the silicon ingot, the upper portion of the cast silicon ingot is cut off. As the impurities contained in the molten silicon move upwards along the solid/liquid interface, segregation of the metal impurities is concentrated at the uppermost portion of the cast silicon ingot (see FIG. 8). Accordingly, it is possible to provide high purity polysilicon by removing the uppermost portion of the cast silicon ingot.

According to this embodiment, the final polysilicon may have a diameter of about 100 mm and a height of 1 to 1000 mm through adjustment of operation time and growth speed. Here, the process is controlled such that the upper portion of the cast silicon where the impurities are concentrated is less than 20% of the overall height of the sample.

The polysilicon produced through this process may have a purity of 5N to 7N and thus may be usefully applied to photovoltaic cells.

Table 1 shows analysis results of purity of an impurity layer and a refining layer through ICP-AES analysis of polysilicon prepared according to the example.

TABLE 1

| | Al | Ca | Fe | Ti | Cu | Mn | Ni | P | Purity % |
|---|---|---|---|---|---|---|---|---|---|
| Raw Silicon | 446 | 148 | 831 | 85.9 | <10 | 158 | <10 | 200 | 98.11 |
| Impurity layer | 2046 | <10 | 22490 | 1696 | 43532 | 190 | 1672 | <1 | 92.84 |
| Refining layer | not detected | not detected | not detected | not detected | not detected | not detected | not detected | not detected | ~99.9999 |

(unit: ppm)

As such, the method and apparatus for manufacturing polysilicon according to embodiments of the invention may allow vacuum refining and unidirectional solidification refining to be performed through application of electron-beam melting, thereby providing high purity polysilicon.

Further, the method and apparatus for manufacturing polysilicon according to the embodiments of the invention may enhance efficiency in removal of volatile impurities and metal impurities through application of high vacuum and electron beams having high energy density.

The polysilicon prepared by the method according to the embodiment has a purity of 5N to 7N and thus may be used for photovoltaic cells.

Example

Next, the constitution and functions of the present invention will be explained in more detail with reference to the following examples. These examples are provided for illustrative purposes only and are not to be in any way construed as limiting the invention.

A description of details apparent to those skilled in the art will be omitted herein.

First, polysilicon was produced by the following process.

A dummy bar was mounted inside the unidirectional solidification unit and a silicon chunk having a purity of 9N and a weight of 180 g was fed thereto. Then, with the vacuum chamber maintained under a high vacuum of 10−5 Torr, an electron beam was irradiated to the silicon at an output energy of 2000 kW/m2 for 10 minutes to melt the raw silicon, and the molten silicon was joined to the dummy bar under the molten silicon.

Silicon powder having a particle size of 1 to 10 mm and fed to the water cooling type crucible through the raw supply apparatus was supplied to the silicon melting unit, and, at the same time, a first electron beam was irradiated to the silicon powder at an output energy of 1000 to 1500 kW/m2 in a pattern shown in FIG. 5 using the first electron gun.

Then, the molten silicon was supplied to the unidirectional solidification unit along the runner, and the start block was lowered at a rate of 0.005 to 0.05 mm/s and cooled while irradiating a second electron beam having an output energy of 1000 to 2000 kW/m2 to the molten silicon in a complex circular pattern as shown in FIG. 6 using the second electron gun so as to maintain the silicon in a molten state.

Figure 7:
FIG. 7 is a picture of a polysilicon ingot prepared in one example of the present invention
Figure 8:
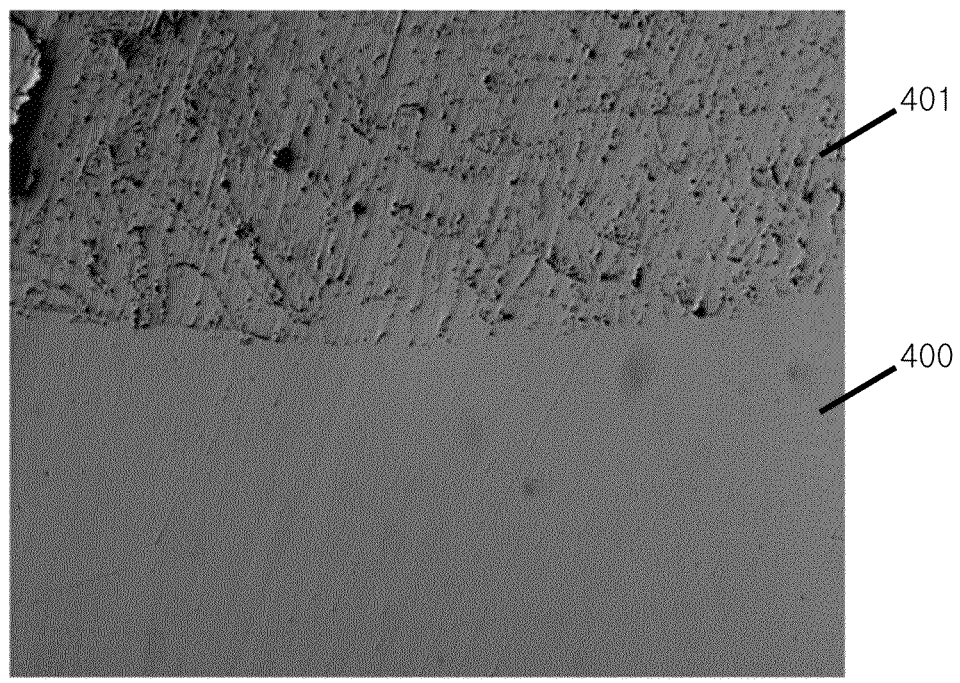
FIG. 8 is a picture of a cross-section near an impurity boundary of the polysilicon ingot prepared according to the one example of the present invention.

FIG. 7 is a picture of a polysilicon ingot prepared in one example of the present invention, and FIG. 8 is a picture of a cross-section near an impurity boundary of the polysilicon ingot prepared according to one example of the present invention.

Referring to FIGS. 7 and 8, it can be seen that metal impurities 401 were moved towards the uppermost portion of an ingot 400 during manufacture of polysilicon.

Referring to Table 1, it can be seen that the raw silicon having a purity of 2N was refined to a purity of 6N and the impurities were concentrated in the impurity layer at the uppermost portion of the polysilicon ingot produced using the apparatus according to the present invention.

Although some embodiments have been described herein, it should be understood by those skilled in the art that these embodiments are given by way of illustration only, and that various modifications, variations, and alterations can be made without departing from the spirit and scope of the invention. Therefore, the scope of the invention should be limited only by the accompanying claims and equivalents thereof.

What is claimed is:

1. A method of manufacturing polysilicon comprising:
   feeding powdery raw silicon to a silicon melting unit and melting the fed raw silicon by irradiating a first electron beam to the raw silicon using a first electron gun;
   continuously feeding and melting the raw silicon such that molten silicon is overflowed from the silicon melting unit;
   receiving, by an unidirectional solidification unit which includes a dummy bar and a silicon button, the molten silicon overflowed from the silicon melting unit, transferring the molten silicon by driving, the silicon button, which is contacted directly on the dummy bar so that the molten silicon is prevented from being contaminated by the dummy bar, in a downward direction followed by solidifying the molten silicon from a lower portion thereof to an upper portion thereof by using a fluid in order to form a refined silicon ingot; and
   cutting off an upper portion of the refined silicon ingot to remove metal impurities from the silicon ingot.

2. The method of claim 1, wherein the raw silicon has a purity of 2N and a mean particle diameter of 1 to 2 mm.

3. The method of claim 1, wherein the feeding powdery raw silicon comprises volatilizing volatile impurities from the raw silicon using the first electron beam under vacuum.

4. The method of claim 3, wherein metal impurities contained in the molten silicon are moved to the upper portion of the molten silicon along a solid/liquid interface during solidification of the molten silicon.

5. The method of claim 1, wherein the first electron gun accelerates and accumulates the first electron beam to achieve an energy of 4000 kW/m$^2$ or less when melting the raw silicon.

6. The method of claim 1, wherein the second electron gun accelerates and accumulates the second electron beam to achieve an energy of 1000 to 2000 kW/m$^2$ when keeping the silicon in a molten state by irradiating the second electron beam.

7. The method of claim 1, wherein the first electron gun accelerates and accumulates the first electron beam to achieve an energy of 4000 kW/m² or less when melting the raw silicon, and the second electron gun accelerates and accumulates the second electron beam to achieve an energy of 1000 to 2000 kW/m² when keeping the silicon in a molten state by irradiating the second electron beam.

8. The method of claim 1, wherein the first electron gun irradiates the first electron beam into the silicon melting unit in a comb pattern with heads arranged towards a runner, and irradiates the first electron beam to the runner in a linearly reciprocating pattern, when melting the raw silicon.

9. The method of claim 1, wherein the second electron gun irradiates the second electron beam to the unidirectional solidification unit in a complex circular or spiral pattern when keeping the silicon in a molten state by irradiating the second electron beam.

10. The method of claim 1, wherein the first electron gun irradiates the first electron beam into the silicon melting unit in a comb pattern with heads arranged towards a runner when melting the raw silicon, and irradiates the first electron beam to the runner in a linearly reciprocating pattern, and the second electron gun irradiates the second electron beam to the unidirectional solidification unit in a complex circular or spiral pattern when keeping the silicon in a molten state by irradiating the second electron beam.

11. The method of claim 1, wherein the molten silicon is transferred while keeping the silicon in a molten state by irradiating a second electron beam upon the molten silicon using a second electron gun.

12. The method of claim 11, wherein the start block is lowered at a rate of 0.005·0.05 mm/s.

13. The method of claim 1, wherein the vacuum chamber is maintained at a vacuum of about $10^{-4}$ Torr or less.

* * * * *